(12) United States Patent
Lee et al.

(10) Patent No.: US 9,491,866 B2
(45) Date of Patent: Nov. 8, 2016

(54) METHOD FOR MANUFACTURING A PRINTED CIRCUIT BOARD

(75) Inventors: Sang Myung Lee, Seoul (KR); Byeong Ho Kim, Seoul (KR); Jin Su Kim, Seoul (KR); Myoung Hwa Nam, Seoul (KR); Yeong Uk Seo, Seoul (KR); Sung Woon Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 500 days.

(21) Appl. No.: 13/809,083

(22) PCT Filed: Jul. 7, 2011

(86) PCT No.: PCT/KR2011/004975
§ 371 (c)(1),
(2), (4) Date: Mar. 27, 2013

(87) PCT Pub. No.: WO2012/005524
PCT Pub. Date: Jan. 12, 2012

(65) Prior Publication Data
US 2013/0192881 A1 Aug. 1, 2013

(30) Foreign Application Priority Data

Jul. 8, 2010 (KR) .................. 10-2010-0065775
Dec. 24, 2010 (KR) .................. 10-2010-0134482

(51) Int. Cl.
*H05K 3/06* (2006.01)
*H05K 3/10* (2006.01)
(Continued)

(52) U.S. Cl.
CPC ............ *H05K 3/062* (2013.01); *H05K 3/0026* (2013.01); *H05K 3/02* (2013.01); *H05K 3/108* (2013.01);
(Continued)

(58) Field of Classification Search
CPC .... H05K 3/062; H05K 3/108; H05K 3/0026; H05K 3/02; H05K 3/0035; Y10T 29/49167
See application file for complete search history.

(56) References Cited

U.S. PATENT DOCUMENTS 5,219,787 A * 6/1993 Carey ............... H01L 21/31144
257/E21.257
5,998,066 A * 12/1999 Block ..................... G03F 1/144
430/296

(Continued)

FOREIGN PATENT DOCUMENTS

JP 05-323574 A 12/1993
JP 07-080675 A 3/1995

(Continued)

OTHER PUBLICATIONS

Notice of Allowance dated Feb. 26, 2013 in Korean Application No. 10-2010-0134482, filed Dec. 24, 2010.
(Continued)

*Primary Examiner* — Peter DungBa Vo
*Assistant Examiner* — Jeffrey T Carley
(74) *Attorney, Agent, or Firm* — Saliwanchik, Lloyd & Eisenschenk

(57) ABSTRACT

Provided is a method for manufacturing a printed circuit board. The method for manufacturing a printed circuit board includes preparing an insulation board, irradiating a laser onto a graytone mask to each a surface of the insulation board, thereby forming a circuit pattern groove and a via hole at the same time, and filling the circuit pattern groove and the via hole to form a buried circuit pattern and the via. Thus, the circuit pattern groove and the via hole may be formed using the graytone mask at the same time without perfoliming a separate process for forming the via hole. Therefore, the manufacturing process may be simplified to reduce the manufacturing costs.

11 Claims, 6 Drawing Sheets

(51) Int. Cl.
*H05K 3/00* (2006.01)
*H05K 3/02* (2006.01)
*H05K 3/46* (2006.01)
*H05K 3/04* (2006.01)

(52) U.S. Cl.
CPC ............ *H05K 3/465* (2013.01); *H05K 3/0032* (2013.01); *H05K 3/045* (2013.01); *H05K 2203/0554* (2013.01); *H05K 2203/0557* (2013.01); *Y10T 29/49167* (2015.01)

(56) References Cited

U.S. PATENT DOCUMENTS

| | | | |
|---|---|---|---|
| 6,250,933 B1* | 6/2001 | Khoury | G01R 1/06738 324/755.07 |
| 7,562,447 B2 | 7/2009 | Lee et al. | |
| 8,072,052 B2 | 12/2011 | Ko et al. | |
| 2008/0265254 A1* | 10/2008 | Nishiura | H01L 27/1255 257/59 |
| 2009/0023236 A1* | 1/2009 | Miyairi | H01L 29/78696 438/30 |
| 2009/0152743 A1 | 6/2009 | Jomaa et al. | |
| 2009/0220867 A1 | 9/2009 | Fujikawa et al. | |
| 2012/0308718 A1 | 12/2012 | Watanabe | |

FOREIGN PATENT DOCUMENTS

| | | |
|---|---|---|
| JP | 07-241690 A | 9/1995 |
| JP | 11-238970 A | 8/1999 |
| JP | 2000-315868 A | 11/2000 |
| JP | 2001-024332 A | 1/2001 |
| JP | 2002-111174 A | 4/2002 |
| JP | 2002-368383 A | 12/2002 |
| JP | 2007-114759 A | 5/2007 |
| KR | 10-2007-0109042 A | 11/2007 |
| KR | 10-0841987 B1 | 6/2008 |
| KR | 10-2009-0009155 A | 1/2009 |
| KR | 10-2009-0033316 A | 4/2009 |
| KR | 10-2009-0064327 A | 6/2009 |
| KR | 10-2009-0096212 A | 9/2009 |
| KR | 10-2010-0114704 A | 10/2010 |
| TW | 200903672 A | 1/2009 |
| TW | 200921266 A | 5/2009 |

OTHER PUBLICATIONS

Japanese Office Action, dated Jan. 28, 2014, in Japanese Application No. 2013-518276.
International Search Report in International Application No. PCT/KR2011/004975, filed Jul. 7, 2011.
Notice of Allowance dated Apr. 17, 2012 in Korean Application No. 10-2010-0065775, filed Jul. 8, 2010.
Office Action dated Aug. 1, 2011 in Korean Application No. 10-2010-0065775, filed Jul. 8, 2010.
Office Action dated Dec. 21, 2011 in Korean Application No. 10-2010-0134482, filed Dec. 24, 2010.
Office Action dated Apr. 25, 2013 in Taiwanese Application No. 100124219, filed Jul. 8, 2011.

* cited by examiner

METHOD FOR MANUFACTURING A PRINTED CIRCUIT BOARD

CROSS-REFERENCE TO RELATED APPLICATIONS

This application is the U.S. national stage application of International Patent Application No. PCT/KR2011/004975, filed Jul. 7, 2011, which claims priority to Korean Application Nos. 10-2010-0065775, filed Jul. 8, 2010 and 10-2010-0134482, filed Dec. 24, 2010, the disclosures of each of which are incorporated herein by reference in their entirety.

TECHNICAL FIELD

The present disclosure relates to a printed circuit board and a method for manufacturing the same.

BACKGROUND ART

Printed circuit boards (PCBs) denote boards just before electric components are mounted. In such a PCB, a circuit line pattern is printed on an insulation board using a conductive material such as copper. That is, the PCB denotes a circuit board in which an installation position of each of the components is decided and a circuit pattern connecting the components to each other is printed and fixed on a surface of the flat plate to densely mount various electric devices on the flat panel.

Specifically, a multi-layer PCB may be used to be built in a cellular phone, a video camera, a notebook, etc., in which high-integration and compact size are required in recent years. The multi-layer PCB (MLB) is manufactured by building up the PCB one by one. In the build-up process, the board may be manufactured and evaluated one by one to improve yield of the multi-layer PCB. Also, the layers may be precisely connected to each other using a wire to realize a small-sized PCB. Hereinafter, a PCB buried within the multi-layer PCB will be referred to as an inner PCB.

For example, in case of a PCB including ten layers, eight inner PCBs may be provided.

Also, an insulation layer may be disposed between the multi-layer PCBs. A circuit pattern metal part, a via hole metal part electrically connected to the inner PCB, and a pad metal part disposed on the via hole metal part may be disposed on a surface of the insulation layer. A trench process using a laser may be performed as a process of forming engraved patterns (i.e., circuit pattern, via hole, and pad part) in which the metal part, the via hole metal part, and the pad metal part are disposed in the insulation layer.

DISCLOSURE OF INVENTION

Technical Problem

However, in the process using the laser according to a related art, at least two or more laser processes may be required. For example, when the circuit pattern and the pad part are disposed inside the multi-layer PCB, an excimer laser process may be performed. Also, to form a via hole, a CO2 laser or the excimer laser process should be additionally performed one time or more. Thus, two or more expensive laser equipments may be required, and also the number of processes may be increased. Thus, productivity and quality may be reduced.

Solution to Problem

Embodiments provide a method for manufacturing a printed circuit board, in which two or more laser processes are reduced into one laser process to improve productivity and quality, and a printed circuit board manufactured by the above-described process.

In one embodiment, a method for manufacturing a printed circuit board includes: stacking a second insulation layer on a first insulation layer in which an inner layer is disposed on a surface thereof to fill the inner layer; forming a circuit pattern and an opening through which the inner layer is exposed on a surface of the second insulation layer using a multi tone mask; and forming a conductive material in the circuit pattern and the opening.

In another embodiment, a printed circuit board includes: an insulation plate; a base circuit pattern patterned on the insulation plate; an insulation layer in which a plurality of circuit pattern grooves, each having a curved shape in section, and a via hole exposing the base circuit pattern are defined in a surface thereof, the insulation layer covering the base circuit pattern on the insulation plate; a plurality of buried circuit patterns filling the circuit pattern groove of the insulation layer and each having a curved shape in section; and a conductive via filling the via hole.

Advantageous Effects of Invention

According the embodiments, the laser process may be performed once to form the circuit pattern, the via hole, and the pad part at the same time, thereby improve process period and circuit defects.

Also, according to the embodiments, the circuit pattern may be buried in the board and has a curved shape in section. Thus, it may prevent the resistance from being concentrated into the edge to reduce the signal noise.

Also, since the edge is not provided to the circuit pattern, the heat to be generated at the edge may be reduced to realize high processing speed and high integration.

Also, since the circuit pattern groove and the via hole are formed using the graytone mask at the same time without performing a separate process for forming the via hole, the manufacturing process may be simplified and the manufacturing costs may be reduced.

BEST MODE FOR CARRYING OUT THE INVENTION

Figure 1:
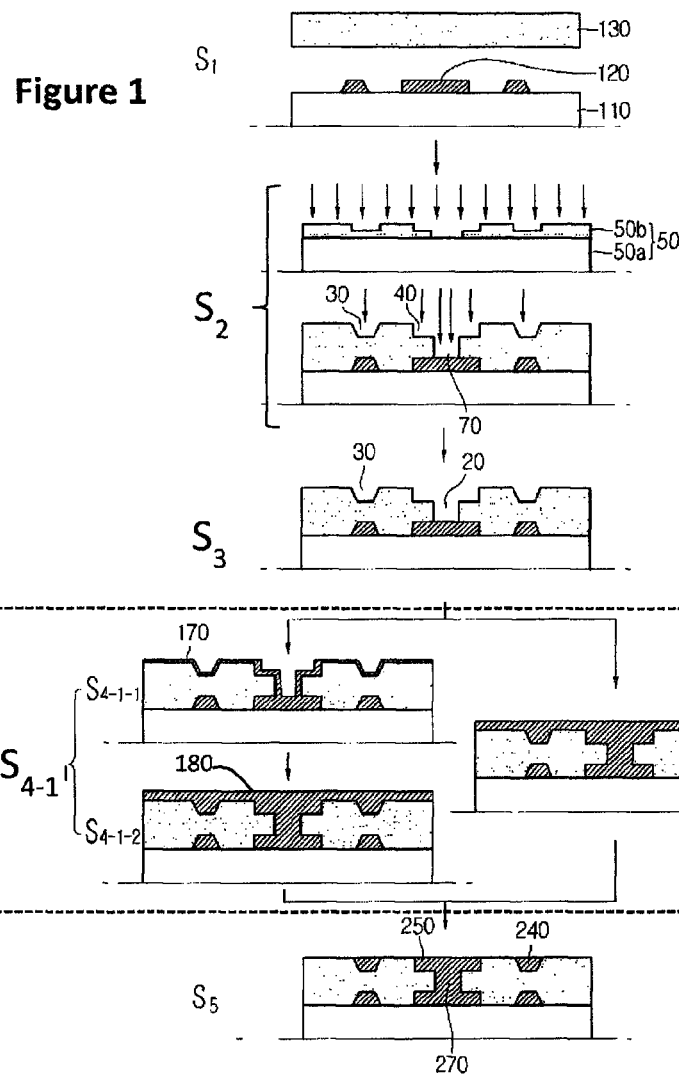
FIG. 1 is a sectional view illustrating a process for manufacturing a printed circuit board according to an embodiment.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein.

In this specification, when it is described that one comprises (or includes or has) some elements, it should be understood that it may comprise (or include or has) only those elements, or it may comprise (or include or have) other elements as well as those elements if there is no specific limitation.

In the drawings, anything unnecessary for describing the present disclosure will be omitted for clarity, and thicknesses are enlarged for the purpose of clearly illustrating layers and areas. Like reference numerals in the drawings denote like elements, and thus their descriptions will be omitted.

In the specification, it will be understood that when a layer, a film, a region, or a plate is referred to as being on another layer, film, region, or plate, it can be directly on the other layer, region, or plate, or intervening layers, films, regions, or plates may also be present. On the other hand, it will also be understood that when a layer, a film, an area or a plate is referred to as being directly on another one, intervening layers, films, areas, and plates may not be present.

FIG. 1 is a sectional view illustrating a process of manufacturing a printed circuit board according to an embodiment.

Referring to FIG. 1, a second insulation layer 130 is stacked or laminated on a first insulation layer 110 (S1). An inner layer 120 is formed on the first insulation layer 110. The inner layer 120 includes an inner circuit and/or an inner pad. The second insulation layer 130 is stacked or laminated to fill the inner layer 120. In the stack or lamination, the first or second insulation layer 110 or 130 may be stacked in a sheet shape and then thermally pressed by a press or may be laminated using a vacuum laminator and then cured. As necessary, third and fourth insulation layers (not shown) may be further stacked through the above-described process. Here, each of the insulation layers 110 and 130 may be formed of one of a thermosetting or thermoplastic polymer material, a ceramic material, an organic/inorganic complex material, and a glass fiber impregnated material.

Thereafter, a circuit pattern 30 and an opening 20 are formed in a surface of the second insulation layer 130 at the same time using a multi tone mask 50 (S2). The multi tone mask 50 is a mask in which laser light or energy can be controlled by two tones or more. The multi tone mask 50 includes two or more light transmitting parts having transmittances different from each other except a light blocking part.

Also, an excimer laser may be irradiated from an upper side of the multi tone mask 50 to process a surface of the second insulation layer 130, the circuit pattern 30, and the opening 20 at the same time. Here, the opening 20 is constituted by a via hole 70 and a pad part 40. In detail, the opening 20 is constituted by the via hole 80 connected up to the inner layer 120 and the pad part 40 formed in an inlet of the opening 20 and having a width greater than that of the via hole 70. Also, the multi tone mask 50 is formed on a base transparent substrate 50a and includes a plurality of light transmitting parts 50b having transmittances different from each other to correspond to positions of the circuit pattern 30, the via hole 70, and the pad part 40, which are formed in the second insulation layer 130.

The base transparent substrate 50a may be formed of a quartz or glass. The light transmitting part may be formed of one of Cr and CrxOy or a combination thereof. A thickness of the light transmitting part 50b may be adjusted to adjust light transmittance. As described above, the multi tone mask 50 in which the circuit pattern 30, the via hole 70, and the pad part 40, which have pattern transmittances different from each other, are formed may be mounted on a laser processing equipment. Then, the excimer laser may be irradiated onto the second insulation layer 130 through the multi tone mask 50. Here, one of XeCl (308 nm), KrF (248 nm), ArF (193 nm) may be used as a source of the excimer laser.

Specifically, each of engraved patterns formed in the second insulation layer 130 using the excimer laser, i.e., the circuit pattern 30, the via hole 70, and the pad part 40 may have a certain width and depth. For example, the circuit pattern 30 may have an engraved width of about 3 μm to about 25 μm and an engraved depth of about 3 μm to about 25 μm. Also, the via hole 70 may have an engraved diameter of about 30 μm to about 80 μm or less and an engraved depth of about 20 μm to about 100 μm or less. Also, the pad part 40 may have an engraved diameter of about 30 μm to 200 μm and an engraved depth of about 1 μm to about 20 μm or less.

As a result, the laser processing is performed at depths different from each other to form the circuit pattern 30, the via hole 70, and the pad part 40 in the second insulation layer 130 at the same time. As described above, the laser process may be performed once using the multi tone mask 50 to realize the desired engraved pattern.

Thereafter, a de-smear process is performed (S3). The de-smear process denotes a process for chemically removing a smear because a resin within an insulation layer is fused due to heat generated by a friction between a rotating drill bit and an inner insulation layer when a hole processing is performed to prevent an inner PCB attached to an inner wall of the hole from adhering. In this process, the smear is removed after the laser etching process is performed. Also, a roughness may be formed on the surface of the second insulation layer 130 to improve adhesion when a metal is plated. Also, the de-smear process may be performed in three stages. For example, a sweller stage, a permanganate stage, and a neutralizer stage may be sequentially performed.

Then, a conductive material is formed in the circuit pattern 30 and the opening 20. Specifically, this process includes a process (S4) for plating the metal on or filling a conductive material into the circuit pattern 30 and the opening 20 and a process (S5) for etching or polishing a top surface of the second insulation layer 130 to uniformly form a surface of the conductive material formed in the circuit pattern 30 and the opening 20 and the surface of the second insulation layer 130.

Specifically, in the process (S4), a process (S4-1) for plating the metal may be used or a process (S4-2) for filling the conductive material may be used. Also, the plating process may include a process (S4-1-1) for forming a seed layer 170 on an entire surface of the second insulation layer 130 using electroless copper plating and a process (S4-2) for performing electro copper plating on the conductive seed layer 170 to form an electro copper plating layer 180.

In the process (S4-1-1), the conductive seed layer 170 may be formed using the electroless (chemistry) plating. This process may be performed using a catalyst extraction process including a cleanet process, a soft etching process, a precatalyst process, a catalyst processing process, an accelerator process, an electroless copper plating process, and an oxidation prevention processing process.

Also, the circuit pattern 30, the via hole 70, and the pad part 40 may be formed using the electroless plating at the same time without performing the process for forming the electrode copper plating layer.

Alternatively, the process for forming the electroless copper plating layer, i.e., the conductive seed layer 170, may be performed using a sputtering process in which ion particles (e.g., Ar+) of gas generated by plasma collide with a copper target to form a metal layer on the substrate. Also, the conductive seed layer 170 may be formed of Cu using the electroless plating or sputtering process. Alternatively, the conductive seed layer 170 may be formed of a Ni—Pd alloy or Ni—Cr alloy using the electroless plating or sputtering process. Also, in a process (S4-1-2), the entire surfaces of the circuit pattern 30, the via hole 70, and the pad part 40 may be filled using the electro plating process. Also, in the process for forming the electro copper plating layer 180, the second insulation layer 130 may be immersed into a copper plating box and then the electro copper plating process may be performed using a DC rectifier. In the electro copper plating process, an area to be plated may be calculated to apply a proper current into the DC rectifier, thereby extracting copper.

Also, in a process (S4-2), filling a conductive paste 190 may be performed. In this process, it is necessary to perform the process (S4-1-1) for forming the conductive seed layer 170. The conductive paste 190 may have a basic composition containing a conductive metal powder, a binder resin, and a solvent. One or more of Ag and Cu, which have a sub micron or nano size, may be used as the conductive metal powder. Also, a thermosetting, thermoplastic, or UV curable resin may be used as the binder resin.

In a process (S5), a surface of a copper plating layer including the conductive seed layer 170 and the electro copper layer 180 or the conductive paste 190 may be etched or polished until the surface of the second insulation layer 130 is exposed to remove the unnecessary copper plating layer. Thus, the copper plating layer may be filled only into the circuit pattern 30, the via hole 70, and the pad part 40. Here, the etching or polishing process may be performed using one of a flash etching process and a surface polishing process. Specifically, the flash etching process may be preferably performed. When the plating layer to be removed is thicker, a half etching process may be additionally performed after the flash etching process is performed, as necessary.

As a result, the inner circuit and the inner layer 120 are filled into the second insulation layer 130 of the finally manufactured printed circuit board. Also, a circuit pattern metal part 240 is formed on the surface of the second insulation layer 130. Also, the inner layer 120 and a pad metal part formed on the surface of the second insulation layer 130 are electrically connected to each other through a via hole metal part 270.

Hereinafter, a printed circuit board according to another embodiment will be described with reference to FIGS. 2 to 10.

Figure 2:
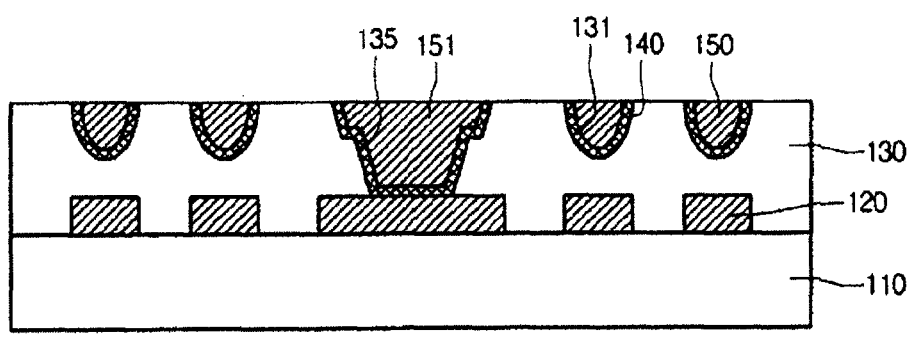
FIG. 2 is a sectional view of a printed circuit board according to another embodiment.

FIG. 2 is a cross-sectional view illustrating a secondary battery according to an embodiment.

Referring to FIG. 2, a printed circuit board 100 according to another embodiment includes an insulation plate 110, a first circuit pattern 120 disposed on the insulation plate 110, an insulation layer 130, and a plurality of second circuit patterns 150.

The insulation plate 110 may be a thermosetting or thermoplastic polymer board, a ceramic board, an organic/inorganic complex board, or a glass fiber impregnated board. When the insulation plate 110 is formed of the polymer resin, the insulation plate 110 may be formed of an epoxy-based insulation resin. Alternatively, the insulation plate 110 may be formed of a polyimide-based resin.

A plurality of first circuit patterns 120 may be disposed on the insulation plate 110 as a basic circuit pattern.

The first circuit pattern 120 may be formed of a material having high conductivity and low resistance. For example, a copper film that is a thin copper layer may be patterned into a conductive layer. When the first circuit pattern 120 is formed of the copper film and the insulation plate 110 is formed of the resin, the first circuit pattern 120 and the insulation plate 110 may be a general copper clad laminate (CCL).

The first circuit pattern 120 may be filled into the insulation plate 110 to form an insulation layer 130.

The insulation layer 130 may be provided in plurality. Each of the insulation layers 130 may be formed of a polymer resin.

The insulation layer 130 has a via hole 135 through which the first circuit pattern 120 is exposed and a circuit pattern groove 131 for forming the plurality of second circuit patterns 150.

Here, the circuit pattern 131 may have a curved shape in section. That is, the circuit pattern 131 may have a U-shape in section.

The circuit pattern groove 131 may have a pattern width of about 3 μm to about 25 μm and a pattern depth of about 3 μm to about 25 μm. The via hole may have an engraved diameter of about 80 μm or less and a depth of about 100 μm or less.

A metal layer 140 may be disposed along the U-shape of the circuit pattern groove 131 within each of the plurality of via holes 135 and circuit pattern grooves 131 of the insulation layer 130.

The metal layer 140 may serve as a seed layer. The metal layer 140 may be formed of copper, nickel, or an alloy thereof.

The second circuit pattern 150 for filling each of the circuit pattern grooves 131 and via holes 135 and a via 151 may be defined in the metal layer 140.

The second circuit pattern 150 and the via 151 may be formed at the same time. Each of the second circuit pattern 150 and via 151 may be formed of at least one of Al, Cu, Ag, Pt, Ni, and Pd. A plating process may be performed using the metal layer as a seed layer to form the second circuit pattern 150 and the via 151.

In case of the printed circuit board 100 of FIG. 2, the circuit pattern groove 131 of the insulation layer 130 has a curved shape. Thus, the circuit pattern groove 131 having the curved shape may be filled with a metal to form the second circuit pattern 150.

As described above, the second circuit pattern 150 is formed into the curved shape without forming an edge to prevent a resistance from being concentrated into the edge. Thus, occurrence of a signal noise may be prevented and generation of heat at the edge may be reduced.

Hereinafter, a method of manufacturing the printed circuit board 100 FIG. 2 will be described with reference to FIGS. 3 to 10.

Figure 3:
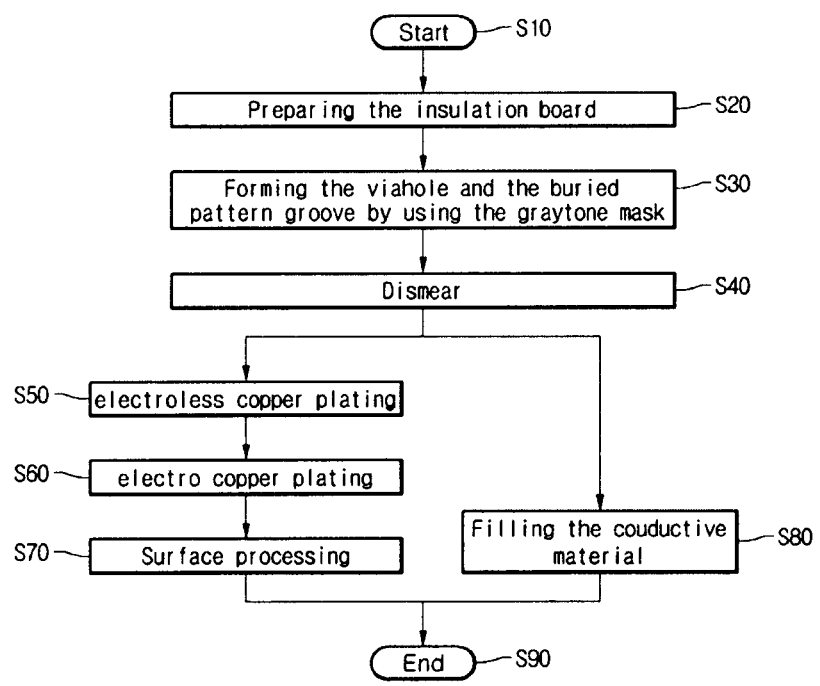
FIG. 3 is a flowchart for explaining a process for manufacturing the printed circuit board of FIG. 2.

FIG. 3 is a flowchart for explaining a process of manufacturing the printed circuit board of FIG. 2. FIGS. 4 to 10 are sectional views illustrating a process for manufacturing a printed circuit board according to an embodiment.

Figure 4:
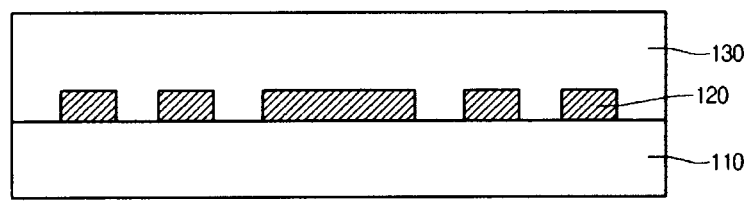
FIGS. 4 to 10 are sectional views illustrating an example of a process for manufacturing a printed circuit board according to an embodiment.

When a process starts in operation S10, a first circuit pattern 120 is formed in an insulation plate 110 of FIG. 4.

A copper layer having a CCL structure may be etched along a profile of the first circuit pattern 120 to form constitutions of the insulation plate 110 and the first circuit pattern 120. Alternatively, a copper layer may be stacked on a ceramic board and then is etched to form the constitutions of the insulation plate 110 and the first circuit pattern 120.

Here, the first circuit pattern 120 may include a pattern connected to the second circuit pattern 150 through the via hole 135 of FIG. 2.

In operation S20, the insulation layer 130 may be formed on the insulation plate 110 to cover the first circuit pattern 120 to prepare an insulation board.

The insulation layer 130 may be formed of a thermosetting resin. Also, a semi-thermosetting resin which is not completely cured may be coated on the insulation plate 110 at a predetermined thickness to apply heat and a pressure, thereby curing the semi-thermosetting resin. As a result, the insulation layer 130 may be formed, and also have a multi-layered structure.

Figure 5:
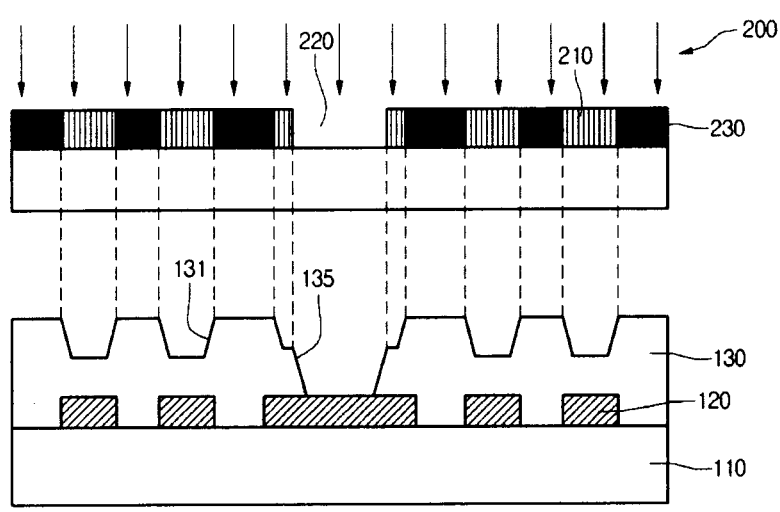

As shown in FIG. 5, in operation S30, a via hole 135 for exposing the first circuit pattern 120 and a pattern groove 131 may be formed in the insulation layer 130 at the same time.

The process for forming the via hole 135 and the pattern groove 131 may be performed by irradiating an excimer laser using a graytone mask.

The excimer laser may include a KrF excimer laser (KrF, a centroid wavelength of about 248 nm) or an ArF excimer laser (ArF, a centroid wavelength of about 193 nm).

Figure 6:
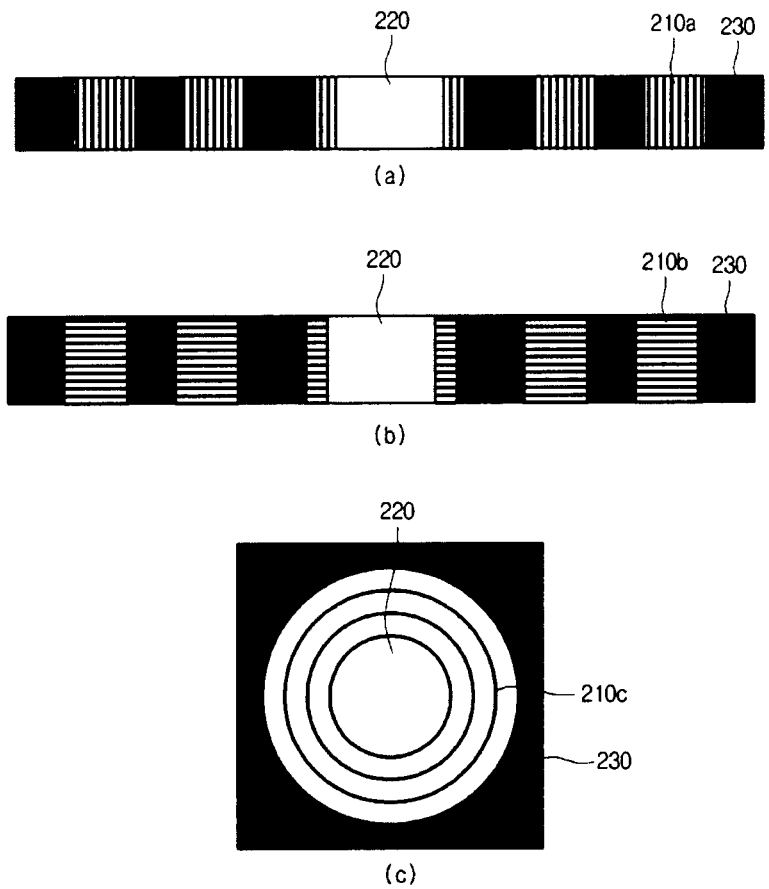

Referring to FIG. 6, the graytone mask 200 will be described in detail. The graytone mask 200 may have a first region 210 for forming an outer circumference of the via hole 135 and the pattern groove 131 in a glass board, a second region 220 for forming a central area of the via hole 135, and a third region 230 defined in a region, which is not etched.

The graytone mask 200 may includes mask patterns formed of a material such as chrome and having the first to third regions 210, 220, and 230.

The chrome may be formed on the entire third region 230 through which the excimer laser does not pass any more and thus a groove is not formed. In the second region 220 defining a central region of the via hole 135, the chrome mask pattern is not formed any more, and thus, the excimer laser passes. The graytone mask pattern may be formed in the first region 210. That is, fine patterns may be formed in the first region 210 to form partially exposed regions so that only a portion of the excimer laser may be selectively irradiated.

That is, as shown in FIG. 5, each of the fine patterns may have a thin thickness and the fine patterns may be spaced from each other in a comb shape in the first region 210. As shown in FIG. 6A, the mask pattern having the comb shape may be vertically disposed with respect to the first region 210a. Alternatively, as shown in FIG. 6B, the mask pattern may be horizontally disposed with respect to the first region 210b.

As shown in FIG. 6C, in the mask pattern of the first region 210 defining the outer circumference of the via hole 135, fine patterns having a plurality of ring shapes may be formed in a concentric circle shape along an outer appearance of the via hole 135.

As described above, the fine patterns of the graytone mask 200 may be formed to partially scatter or reflect light of the laser. Thus, light energy irradiated onto the insulation layer 130 may be different from that of the region of the via hole 135. Accordingly, the via hole 135 and the circuit pattern groove 131 may have depths different from each other.

The mask 200 of FIG. 6 and the via hole 135 and the pattern groove 131, which are formed by the excimer laser at the same time, may have the same shape as those of FIG. 5.

That is, the via hole 135 may have a side surface inclined at a predetermined angle with respect to a plane of the insulation plate 110. On the other hand, the via hole 135 may have a side surface perpendicular to the plane of the insulation plate 110.

Here, an outer circumference of the via hole 135 may have a depth equal to that of the circuit pattern groove 131.

As shown in FIG. 5, since the excimer laser is irradiated once using the graytone mask 200 to form the circuit pattern groove 131 and the via hole 135 at the same time, the number of processes and costs may be reduced.

Although the outer circumference of the via hole 135 has the same depth as that of the circuit pattern groove 131 in FIG. 5, the circuit pattern groove 131 and the outer circumference of the via hole 135 may have depths different from each other according to embodiments. The depths of the circuit pattern groove 131 and the via hole 135 may be controlled according a concentration of the graytone, i.e., an intensity of the tomb.

As shown in FIG. 5, when the circuit pattern groove 131 is formed through the pattern mask 200 using the excimer laser the pattern groove 131 may have an edge having a trapezoid shape or a rectangular shape in section.

Figure 7:
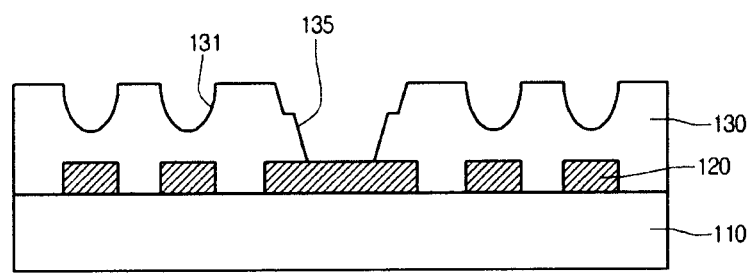

As shown in FIG. 7, the pattern groove 131 having the edge of the insulation layer 130 may be processed and deformed in a curved shape in operation S40.

That is, the insulation layer 130 having the circuit pattern groove 131 with the edge may be inflated to remove the inflated insulation layer 130 using permanganate. Then, a wet etching process for neutralizing a surface of the insulation layer 130 may be performed to the edge of the circuit pattern groove 131 to form the circuit pattern groove 131 having the curved shape.

Alternatively, a dry plasma process using plasma under a low vacuum state may be performed to remove the edge of the circuit pattern groove 131.

As described above, when the edge of the circuit pattern groove 131 is removed, a roughness may be formed on the surface of the insulation layer 130.

Figure 8:
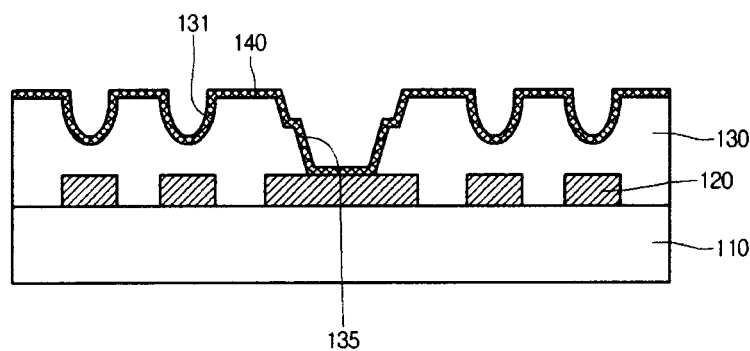
Figure 9:
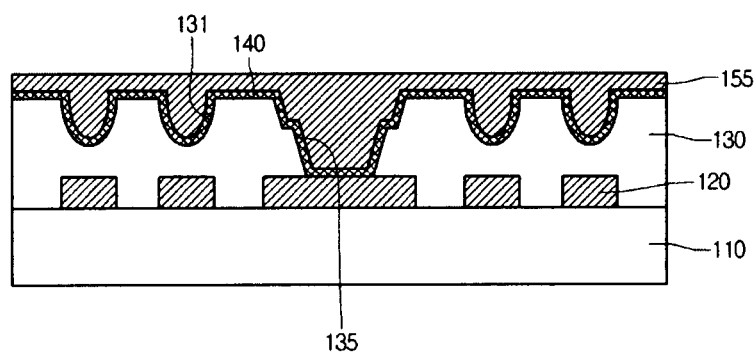

Then, as shown in FIG. 8, a metal layer 140 is formed on the insulation layer in operation S50.

An electroless plating process may be performed to form the metal layer 140.

The electroless plating process may be performed by successively performing a cleanet process, a soft etching process, a precatalyst process, a catalyst processing process, an accelerator process, an electroless copper plating process, and an oxidation prevention processing process. Also, metal particles may be sputtered using plasma to form the metal layer 140.

The metal layer 140 may be formed of Cu, Ni, Pd, Cr, or an alloy thereof.

In operation S60, an electro plating process may be performed on a conductive material using the metal layer 140 as a seed layer to form the plating layer 155.

The plating layer 155 may completely fill the circuit pattern groove 131 and the via hole 135. Also, the uppermost of the plating layer may have a uniform height.

Here, the plating layer 155 may be formed of copper having high conductivity.

Figure 10:
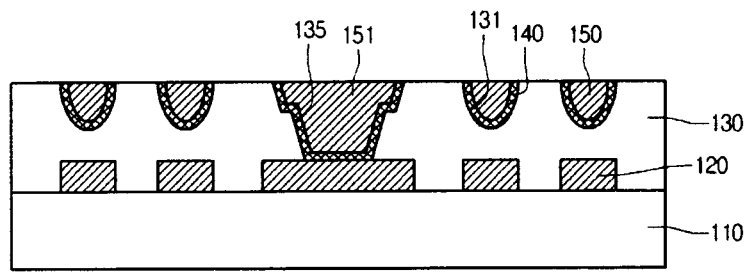

As shown in FIG. 10, the unnecessary plating layer 155 and metal layer 140 may be etched. That is, the plating layer 155 and metal layer 140 may be etched until the surface of the insulation layer 130 is exposed so that the plating layer 155 remains only within the pattern groove 131 and the via hole 135 to form a second circuit pattern 150 and a via 151.

Here, the process for exposing the surface of the insulation layer 130 may selectively use a flash etching process or a surface polishing process. When the plating layer 155 has a thick thickness, the flash etching process may be performed after a half etching process is performed.

As described above, the etching process may be performed until the insulation layer 130 is exposed to form the plating layer 155 only within the circuit pattern groove 131 and the via hole 135, thereby forming the second circuit pattern 150 and the via 151. Thus, the second circuit pattern 150 may be insulated.

Also, since the pattern groove 131 and the via hole 135 are formed using the excimer laser at the same time, manufacturing costs may be reduced.

Figure 11:
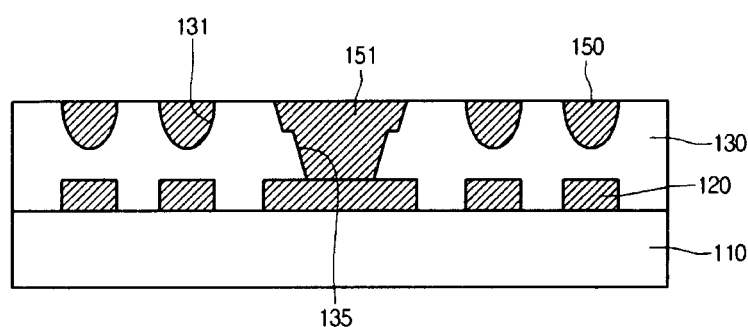
FIGS. 11 and 12 are sectional views illustrating the printed circuit board and a process for manufacturing the printed circuit board according to another embodiment.

Unlike FIGS. 4 to 10, in operation S80, the circuit pattern groove having the curved shape and the via hole 135 may be formed, and then, the conductive paste 190 may be filled within the circuit pattern groove 155 and the via hole 135, thereby forming the second circuit pattern 150 and the via 151 of FIG. 11.

Here, the conductive paste 155 may contain a conductive metal powder, a binder resin, and a solvent. The conductive metal powder may contain silver or copper having a sub micron or nano size. Also, a thermosetting, thermoplastic, or UV curable resin may be used as the binder resin.

Figure 12:
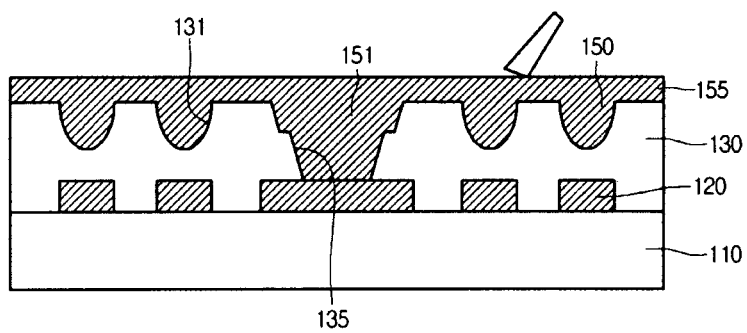

That is, although the same process as those of FIGS. 4 to 7 is performed, as shown in FIG. 12, the conductive paste 155 may be filled into the circuit pattern groove 131 to apply heat or UV, thereby forming the second circuit pattern 150. Then, in operation S90, the manufacturing process may be ended. Here, the metal layer 140 of FIG. 2 may be unnecessary.

As described above, the circuit pattern groove 131 has a curved shape, and the circuit pattern is formed in the circuit pattern groove 131 to the buried-type fine patterns. Therefore, it may prevent the signal noise and heat from being generated at the edge.

According the embodiments, the laser process may be performed once to form the circuit pattern, the via hole, and the pad part at the same time, thereby improve process period and circuit defects.

Also, according to the embodiments, the circuit pattern may be buried in the board and has a curved shape in section. Thus, it may prevent the resistance from being concentrated into the edge to reduce the signal noise.

Also, since the edge is not provided to the circuit pattern, the heat to be generated at the edge may be reduced to realize high processing speed and high integration.

Also, since the circuit pattern groove and the via hole are formed using the graytone mask at the same time without performing a separate process for forming the via hole, the manufacturing process may be simplified and the manufacturing costs may be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a printed circuit board, the method comprising:
   preparing an insulation board;
   forming a first circuit pattern groove and a via hole by removing a surface of the insulation board by using a multi tone mask or a gray tone mask, wherein the first circuit pattern groove has an edge;
   forming a second circuit pattern groove by removing the edge of the first circuit pattern groove, wherein the second circuit pattern groove is a final result of etching the edge of the first circuit pattern groove to form a curved shape; and
   forming a circuit pattern and a via to fill the second circuit pattern groove and the via hole;
   wherein the multi tone mask or the gray tone mask have a first region for forming an outer circumference of the via hole and the first circuit pattern groove, a second region for forming a central area of the via hole, and a third region defined in a region that is not etched;
   wherein the first region comprises a first part spaced apart from the second region, and a second part surrounding the second region;
   wherein the first circuit pattern groove and the via hole are formed at the same time by using the first region, the second region, and the third region of the multi tone mask or the gray tone mask; and
   wherein the second circuit pattern groove has a semicircle cross-sectional shape.

2. The method according to claim 1, wherein the forming of the first circuit pattern groove and the via hole comprises:
   irradiating a laser through the first to third mask regions of the multi tone mask or the gray tone mask.

3. The method according to claim 2, wherein the laser is an excimer laser.

4. The method according to claim 2, wherein the second region has a hole region through which the laser completely passes,
   the third region has a non-transmitting region through which the laser is blocked, and
   the first region has a low-transmitting region for selectively transmitting the laser.

5. The method according to claim 4, wherein the second part of the first region comprises a low-transmitting pattern having a ring shape and a plurality of concentric circle shapes around the second region.

6. The method according to claim 3, wherein one of XeCl, KrF, and ArF is used as a source of the excimer laser.

7. The method according to claim 1, wherein the multi tone mask comprises:
   a base transparent board formed of a quartz or glass material; and
   a plurality of light transmitting parts formed on the base transparent board, the plurality of light transmitting parts being formed of one or more materials of Cr and CrO.

8. The method according to claim 1, wherein the forming of the circuit pattern comprises:
   plating a first metal layer on a surface of the second circuit pattern groove;
   forming a second metal layer filling the second circuit pattern groove by using the first metal layer as a seed layer; and etching the first and second metal layers except the second circuit pattern groove to expose the surface of the insulation board.

9. The method according to claim 1, wherein the forming of the circuit pattern comprises:

filling a conductive paste into the second circuit pattern groove; and drying the filled conductive paste.

10. The method according to claim 1, wherein the preparing of the insulation board comprises:

preparing an insulation plate;

patterning a copper film layer on the insulation plate to form a base circuit pattern; and forming an insulation layer covering the base circuit pattern on the insulation plate, wherein the first circuit pattern groove and the second circuit pattern groove are formed in a surface of the insulation layer.

11. The method according to claim 10, wherein the via hole exposes a top surface of the base circuit pattern.

* * * * *